(12) United States Patent
Dixon

(10) Patent No.: US 6,853,558 B1
(45) Date of Patent: Feb. 8, 2005

(54) SURFACE MOUNT POWER SUPPLY DEVICE AND ASSOCIATED METHOD

(75) Inventor: Duane Dixon, Tucson, AZ (US)

(73) Assignee: Artesyn Technologies, Inc., Boca Raton, FL (US)

( * ) Notice: Subject to any disclaimer, the term of this patent is extended or adjusted under 35 U.S.C. 154(b) by 582 days.

(21) Appl. No.: 09/684,124

(22) Filed: Oct. 6, 2000

(51) Int. Cl.[7] ............................................... H05K 1/18
(52) U.S. Cl. ...................... 361/761; 361/760; 361/763; 361/767; 361/813; 174/260; 174/261
(58) Field of Search ................................ 361/760–761, 361/763–764, 767, 813, 790, 735, 803, 783, 743; 174/260–261; 257/778–779, 783, 666, 723–724, 777; 29/840, 827

(56) References Cited

U.S. PATENT DOCUMENTS

| | | | | |
|---|---|---|---|---|
| 4,959,750 A | * | 9/1990 | Cnyrim et al. | 361/761 |
| 5,041,901 A | * | 8/1991 | Kitano et al. | 257/779 |
| 5,191,404 A | * | 3/1993 | Wu et al. | 257/724 |
| 5,386,343 A | * | 1/1995 | Pao | 361/761 |
| 5,406,119 A | * | 4/1995 | Numada | 257/692 |
| 5,689,600 A | * | 11/1997 | Griffin | 385/88 |
| 5,821,614 A | * | 10/1998 | Hashimoto et al. | 257/679 |
| 5,920,461 A | | 7/1999 | Brune et al. | |
| 5,959,842 A | | 9/1999 | Leonard et al. | |

OTHER PUBLICATIONS

"Surface Mount Technology for PC Boards", James K. Hollomon, Jr., Prompt Publications, 1995, pp. 88–90.
"The AzDenz Series: 4.5A Family Product Brief", AzCore Technologies, www.azcore.com, Jun. 12, 2000.

* cited by examiner

Primary Examiner—David Zarneke
Assistant Examiner—Thanh Y. Tran
(74) Attorney, Agent, or Firm—Kirkpatrick & Lockhart LLP

(57) ABSTRACT

A surface mount power supply device and a method for mounting a lead frame to a circuit board, which has a first and second side, and assembling such a device. The lead frame has leads with a lead solder area for contact with solder material on the circuit board. According to the method, the lead frame and a first set of electrical components are reflow soldered on the first side of the circuit board. Then the circuit board is inverted and a second set of electrical components are reflow soldered on the second surface of the circuit board. The lead solder area and in particular the ratio of the weight of the frame to the lead solder area is chosen so that the lead frame remains connected to the first side of circuit board during the second reflow soldering.

21 Claims, 3 Drawing Sheets

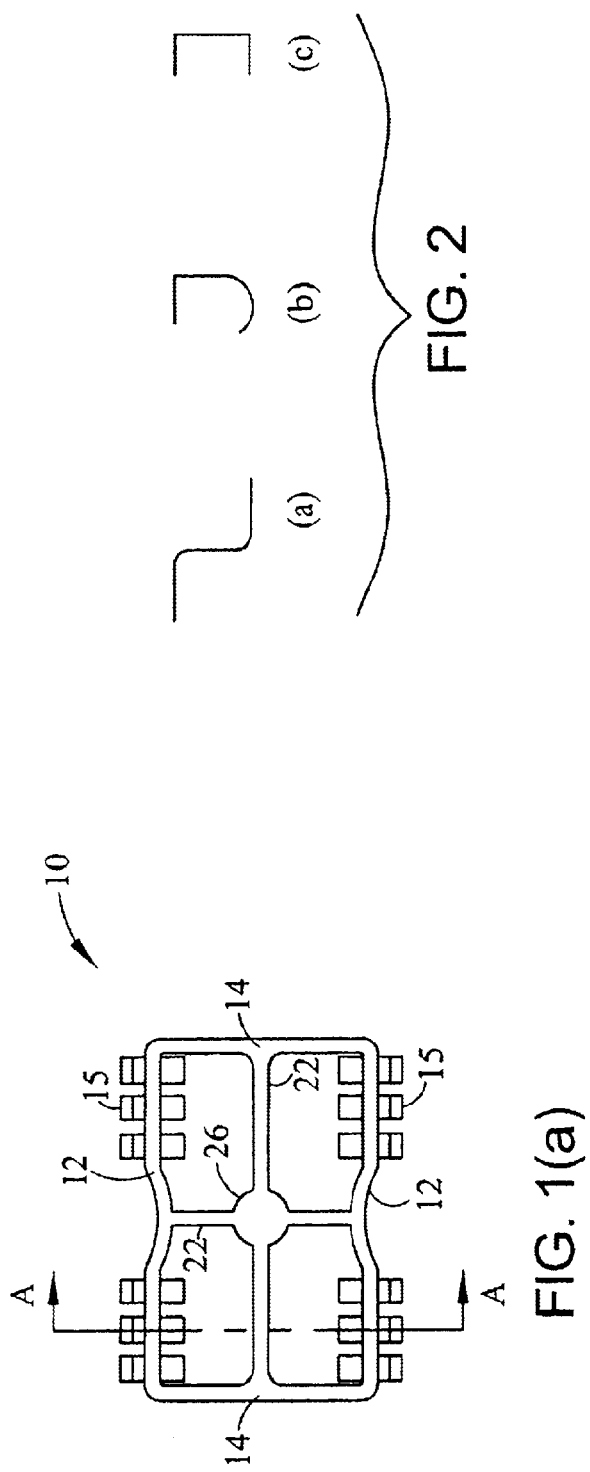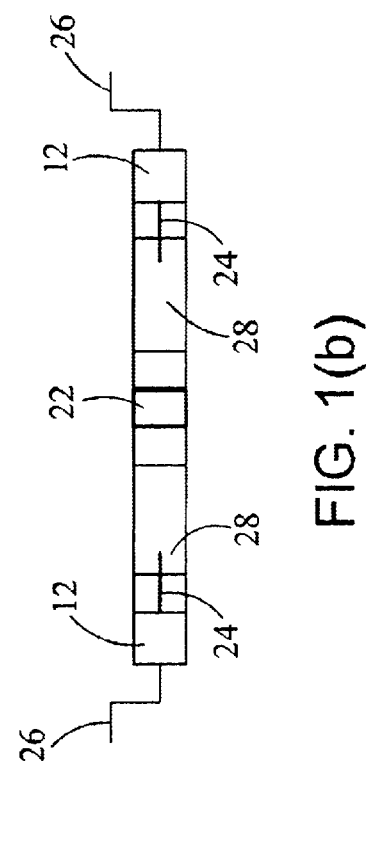

SURFACE MOUNT POWER SUPPLY DEVICE AND ASSOCIATED METHOD

CROSS-REFERENCE TO RELATED APPLICATIONS

Not applicable.

FEDERALLY SPONSORED RESEARCH

Not applicable.

BACKGROUND OF THE INVENTION

1. Field of the Invention

The invention relates to surface mount technology, and more particularly to a surface mount power supply device and associated method.

2. Description of the Invention Background

Surface mount technology ("SMT") is the technology associated with a manufacturing process whereby electronic components are mounted and soldered to pads on the surface of a circuit board rather than having their leads inserted into through-holes in the circuit board. SMT has many advantages over the through-hole assembly, including simpler automated manufacturing process, higher density component placement and better miniaturization, greater speed of assembly, etc. One of the limitations of SMT has been component availability. In particular the need for a surface mount DC/DC converter has been identified in U.S. Pat. No. 5,920,461 to Brune ("Brune"). Brune discloses a surface mount power supply device comprising a first printed circuit board, and a lead frame having a plurality of vertically extended pins. One end of each pin is inserted into a corresponding hole drilled on one side of the first printed circuit board, while the other end (the "head") of each pin provides a surface for electrical connection with a second printed circuit board. In other words, the lead frame is through-hole mounted. The resulting device is still hampered by the disadvantages of the through-hole technology, such as the extra step of drilling holes and matching the pins of the lead frame, and does not fully enjoy the advantages of SMT. Moreover, care must be taken to ensure that coplanarity of the heads of the pins is maintained after reflow, for example by using alignment pins.

U.S. Pat. No. 5,959,842 discloses a surface mount package for containing a board-mounted power supply and associated method. The surface mount package includes a frame that has leads with through-hole mount ends configured to pass through corresponding openings in a circuit board. The frame may include retention clips to retain the frame to the circuit board. All the power supply components are mounted on one side of the board. The package is encapsulated in a shell, and potting material is injected. This surface mount package still relies in through-hole technology and uses a shell and potting material for thermal dissipation.

Other prior-art devices rely on the use of adhesive to hold the lead frame onto a circuit board when components are mounted on both sides of the circuit board by reflow soldering. Using adhesive adds an additional step to the manufacturing process with concomitant cost and time loss. There remains, therefore, a need for an improved surface mount power supply device and method that overcomes the limitations, shortcomings and disadvantages of the prior-art surface mount power supply devices.

SUMMARY OF THE INVENTION

The present invention meets the identified needs, as well as other needs, as will be more fully understood following a review of this specification and drawings.

The invention discloses a surface mount power supply device and a method for mounting a lead frame to a circuit board, which has a first and second side, to assemble such a device. The lead frame has leads with a lead solder area for contact with solder material on the circuit board. According to the method, the lead frame and a first set of electrical components are reflow soldered on the first side of the circuit board. Then the circuit board is inverted and a second set of electrical components is reflow soldered on the second side of the circuit board. The lead solder area, in particular the ratio of the weight of the frame to the lead solder area, is chosen so that the lead frame remains connected to the first side of circuit board during the second reflow soldering. The electrical components positioned on the first side of the circuit board are typically low-profile components. The lead frame is typically made of lightweight dielectric material with metal leads, and is substantially rigid.

BRIEF DESCRIPTION OF THE DRAWINGS

FIG. 1(a) is a plan view of a lead frame used in the present invention;

FIG. 1(b) is a sectional view of the lead frame of FIG. 1(a) along the A-A axis;

FIG. 2(a) is a side elevational view of a gull-wing lead that may be used with the lead frame shown in FIG. 1(a);

FIG. 2(b) is a side elevational view of a J lead that may be used with the lead frame shown in FIG. 1(a);

FIG. 2(c) is a side elevational view of a C lead that may be used with the lead frame shown in FIG. 1(a);

FIG. 6(a) is a plan view of a second side of a circuit board that may be used in the present invention.

DETAILED DESCRIPTION OF THE INVENTION

Figure 3:
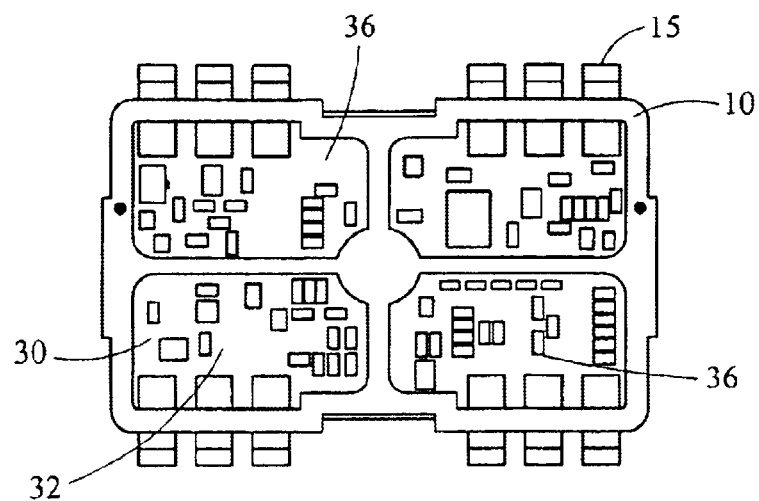
FIG. 3 is a plan view of a device showing a first side of a circuit board with the lead frame shown in FIG. 1(a) attached thereto in accordance with the present invention.
Figure 4:
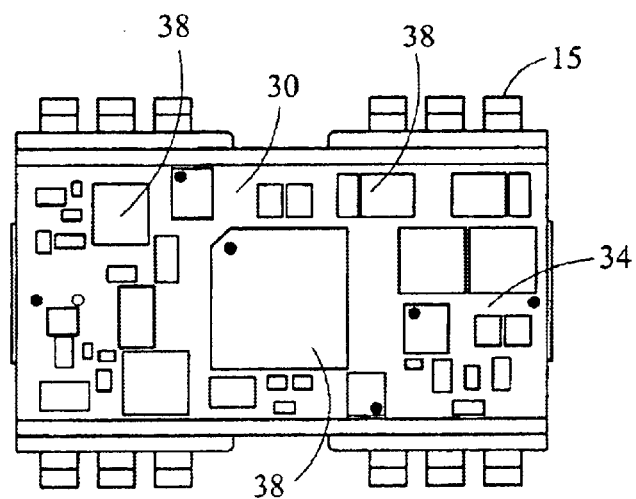
FIG. 4 is a plan view of the device of FIG. 3 showing the second side of the circuit board.
Figure 5:
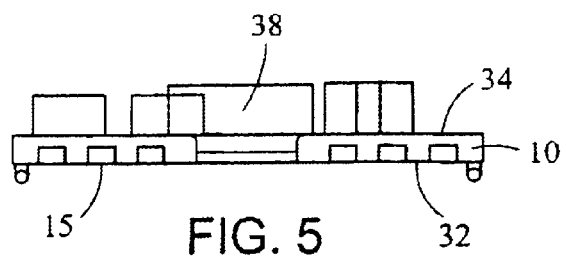
FIG. 5 is a side view of the device of FIG. 3.

Referring now to the drawings for the purpose of illustrating the invention and not for the purpose of limiting the same, FIGS. 1(a) and (b) show an embodiment of a lead frame 10 used in connection with the present invention. The lead frame 10, as shown, may have, for example, a generally a tetragonal shape with two parallel longitudinal sides 12 connected to two transverse sides 14. A generally flat circular hub 20 is supported by four arms 22 connected to the hub and to one of the longitudinal 12 or transverse 14 sides of the lead frame 10. Connected to the longitudinal sides 12 of the lead frame 10 is a set of metal leads 15, each lead having an inner end 28 and an outer end or contact end 26.

The lead frame 10, except for the leads 15, is preferably made of lightweight material, such as, for example, a dielectric material, or a liquid crystal polymer, such as Sumikasuper® LCP E-4008 manufactured by Sumimoto Chemical, and is preformed, for example, by injection-molding. To reduce the weight of the lead frame, only material sufficient to provide rigidity to hold the outer ends 26 of the leads 15 coplanar is preferably used, because the outer ends 26 will be electrically connected to an end user device. The material is distributed around the tetragon 16 of the lead frame during the injection molding process so that it provides support for one or more sets of leads 15 and a hub 20, which is preferably at the center of the lead frame 10. The hub 20 is sized so as to enable a conventional automated pick-and-place machine to pick the lead frame 10 by the hub 20. The shape of the lead frame 10 shown in FIG. 1(a) is rectangular, and the hub 20 shown in FIG. 1(a) is supported by four arms 22, but it will be appreciated that other shapes and support configurations may be used. The leads 15 are attached to the lead frame 10 during the injection molding process and are typically gull-wing shaped, as shown in FIG. 2(a), although other shapes such as J and C leads shown respectively in FIGS. 2(b) and 2(c) may be used depending on the application. The inner ends 28 of the leads 15 have a lead solder area 24 for contact with solder material, such as solder paste.

Figure 6B:
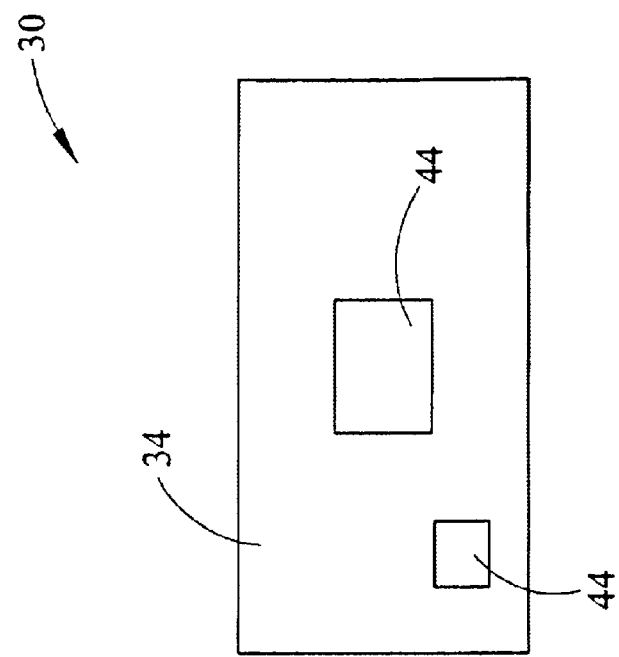
FIG. 6(a) is a plan view of a first side of a circuit board that may be used in the present invention.
Figure 6A:
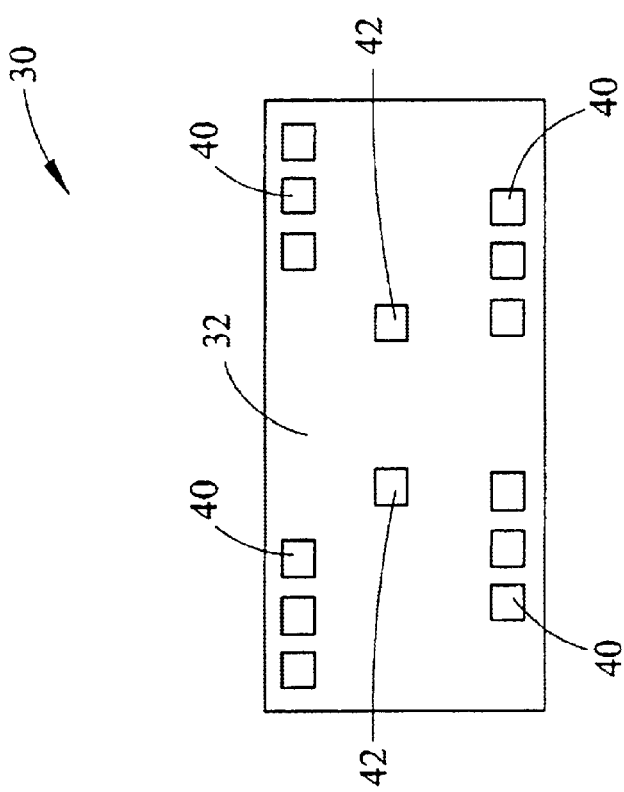

Referring to FIGS. 3–6(b), the lead frame 10 is mounted on a first side 32 of a circuit board 30 and is attached to the circuit board 30 over the lead solder area 24 by a first pass reflow soldering. The circuit board 30 has also a second side 34. As shown in FIG. 6(a), the first side 32 of the circuit board 30 has a plurality of metallized lead pads 40 for connection with the lead solder area 24 of the lead frame, and a plurality of component pads 42 for connection with the generally low-profile electrical components 36 that may be mounted on the first side 32 of the circuit board 30. As shown in FIG. 6(b), the second side 34 of the circuit board 30 has a plurality of metallized component pads 44 for electrical connection with the generally high profile electrical components 38 that may be mounted on the second side 34 of the circuit board 30. The circuit board 30 is made of a standard fiberglass laminate, such as FR-4, or other suitable material such as ceramic, metal clad, etc. Solder paste is spread over the pads of the circuit board 30 for reflow soldering.

The first set of components 36 may comprise generally low profile, low heat dissipating components, which are typically lighter and smaller in size in comparison to the components that will be attached on a second side 34 of the circuit board 30. For a surface mount power supply device, the generally smaller control components, such as, for example, resistors and capacitors, are mounted on the first side 32 of the circuit board 30. The term "low-profile" is used herein to describe such components with small size and low heat dissipation. The relatively bigger power components, such as, for example, transformers, are mounted on the second side 34 of the circuit board 30. The term "high-profile" is used herein to describe components that generally dissipate more heat and are bigger in size in comparison to the low-profile components.

After solder paste is spread on the lead pads 40 and component pads 42 of the first side 32 of the circuit board 30, the lead frame 10 and a first set of electrical components 36 are attached to the first side 32 of the circuit board 30 by the described reflow soldering. As is generally known, reflow soldering is the process of joining two metallic surfaces, such as the lead solder area 24 and the lead pads 40, by placing solder paste over one metallic surface, placing the other metallic surface in contact with the solder paste, heating the assembly until the solder melts and fuses, and then allowing the metallic surfaces to cool in the joined position. Solder paste is a mixture of fine solder particles, flux and its activators, and a carrier. For reflow soldering, the carrier in the solder paste is thixotropic, i.e. it loses viscosity and flows under stress, such as caused by pressure or stirring, but returns to its previous viscous state when the stress is removed. Thixotropic solder paste may be dispensed by several methods, including screen or stencil printing, since the paste will flow when stressed by the squeegee of a stencil printer through the apertures of the stencil, and will return to its viscous form, staying on the metallized pads and not flowing on the nonmetallized surface of the circuit board after the stress applied by the squeegee is removed.

After the first pass reflow, the lead frame 10 with the attached circuit board 30 is inverted, i.e. may be rotated about 180°, so that the lead frame 10 and the first side 32 with the already mounted first set of electrical components 36 are on the underside of the circuit board 30. It will be appreciated that inverting the circuit board 30 may generally refer to any rotation that will cause the lead frame 10 to have a tendency to pull away from the first side 32 of the circuit board 30 because of the force of gravity. Solder paste is spread over the second side 34 to cover the component pads 44 on the second side 34 of the circuit board 30 and a second set of electrical components 38, comprising primarily high-profile components, are placed on the component pads 44 so that metallized surfaces of these components 38 are in contact with the solder paste. The entire assembly undergoes a second reflow soldering process, which is a first pass for the components 38 of the second side 34, and a second pass for the lead frame 10 and the components 36 of the first side 32. During the second reflow soldering, the lead frame 10 is held in place by molten solder. It will remain in contact with the circuit board 30 only if there is enough solder surface tension to hold it, because the lead frame 10 is soldered directly on the circuit board, i.e. without the use of adhesive either in the solder or as a separate layer attaching the component to the board after solder paste is spread. Moreover, the lead frame is not held by any other structural means.

Although the prior art discloses that surface tension may be relied upon to keep low-profile components 36 in contact with the circuit board 30 during second pass reflow soldering, when the circuit board 30 has been inverted, surface tension has not been relied upon to mount a lead frame 10 on circuit boar 30. This principle would not work with the prior-art lead carriers, because they are typically too heavy and typically need to be attached to the circuit board by other structural means, such as pins inserted into sockets or holes drilled in the circuit board, as for example in the surface mount power supply device disclosed by Brune, discussed hereinabove.

The lightweight lead frame 10 of the present invention is designed specifically for the purpose of enabling molten solder paste that has already been reflowed to hold the weight of the frame 10 without relying on adhesive material or through-hole mounting. The lead frame is designed so that the weight of the lead frame including the leads, W, and the lead solder area S that comes in contact with the solder paste on respective lead pads 40 of the first side 32 of the circuit board 30 have a predetermined ratio R, which is equal to W divided by S. The lead solder area S is the sum of the solder areas of the individual leads 15 in contact with the solder on the first side 32 of the circuit board 30, so that S is equal to the number of leads, n, times the solder area, s, of each lead to the circuit board:

$$R=W/S \tag{1}$$

$$S=ns \tag{2}$$

It has been determined that a value of R less than about 30 grams per square inch will hold the lead frame 10 on the underside of the circuit board 30 during second pass reflow soldering. For the lead frame 10 shown in FIG. 1(a), W is about 1.9 grams, s is 0.01 square inches and n=12, and the predetermined ratio R is about 15.8 grams per square inch for this lead frame. The term "lead solder area" and the reference number 24 are used to refer to the area S.

The first and second set of electrical components 36, 38 and the board circuitry may be chosen so that the assembled device is, for example, a DC/DC converter, although other devices may be assembled by the same method. In the case of a DC/DC converter, the assembled device weighs only about 12 grams for model SXE15-48S05 manufactured by AzCore Technology, a division of Artesyn Technology. For more efficient assembly the lead frame may be prefabricated to meet the design specifications outlined above. In a typical fabrication process, four frames may be manufactured at a time using a four-unit mold. First, the strips of metal for the leads are stamped. Strips for four lead frames are held together by tie bars and are placed into a four-unit mold, which is then injected with plastic material, such as Sumikasuper® LCP E-4008. After molding, the leads 15 are plated to improve solderability using, for example, electrodeposited tin-lead plating over nickel plating. The tie bars are trimmed, yielding four separate lead frames. Because the leads are preformed and held in the plastic material of the relatively rigid frame, coplanarity of leads is maintained, while the additional step of forming leads during the manufacturing process of the device in which the frame is incorporated is avoided. The relatively rigid construction of the lead frame minimizes mechanical deformation from material handling through the manufacturing cycle. The lightweight construction and the substantially flat hub 20 of the lead frame 10 allows the device to be vacuum picked by an automatic pick-and-place machine for transferring the device from a packaging line to an end user manufacturing line.

Whereas particular embodiments of the invention have been described herein for the purpose of illustrating the invention and not for the purpose of limiting the same, it will be appreciated by those of ordinary skill in the art that numerous variations of the details, materials and arrangement of parts may be made within the principle and scope of the invention without departing from the invention as described in the appended claims.

What is claimed is:

1. A method for mounting a lead frame to a circuit board comprising:
   first reflow soldering of the lead frame and a first set of electrical components on a first side of the circuit board, the first side of the circuit board having thereon a plurality of pads for electrical connections and the lead frame having leads with a lead solder area for contact with solder material on the plurality of pads of the first side;
   inverting the circuit board; and
   second reflow soldering of a second set of electrical components on a second side of the circuit board, the second side of the circuit board having thereon a plurality of pads for electrical connections, wherein the lead solder area is such that the lead frame stays connected to the first side of circuit board during the second reflow soldering.

2. The method of claim 1, wherein the ratio of the weight of the frame to the lead solder area is less than about 30 grams per square inch.

3. The method of claim 1, wherein the first set of electrical components includes low-profile electrical components.

4. The method of claim 1, wherein the lead frame is formed of a dielectric material with metal leads.

5. The method of claim 1, wherein the lead frame has a hub.

6. The method of claim 1, wherein each of the electrical components of the first set have a ratio of weight to solder area such that they are held in contact with the circuit board during the second reflow soldering.

7. The method of claim 1, further comprising attaching the first set of electrical components with an adhesive prior to the first reflow soldering.

8. The method of claim 1, wherein the circuit board comprises FR-4 material.

9. The method of claim 1, wherein the lead frame is substantially rigid.

10. The method of claim 9 wherein the leads of the lead frame are substantially coplanar.

11. A method for assembling a surface mount power supply device, the method comprising:
    providing a circuit board having a first and second side and a plurality of pads for electrical connections on each of the first and second sides;
    applying a first amount of solder material on the plurality of pads of the first side;
    positioning a first set of electrical components on the first side of the circuit board in contact with the solder material;
    positioning a lead frame having leads so that the lead frame is adjacent to the first side of the circuit board and the leads are in contact with the solder material over a lead solder area;
    first reflow soldering of the first side of the circuit board;
    inverting the circuit board;
    applying a second amount of solder material on the plurality of pads of the second side;
    positioning a second set of electrical components on the second side of the circuit board in contact with the solder material; and
    second reflow soldering with the second side of the circuit board, wherein the ratio of the weight of the frame to the lead solder area is such that the lead frame stays connected to the first side of circuit board during the second reflow soldering.

12. The method of claim 11, wherein the ratio of the weight of the frame to the lead solder area is less than about 30 grams per square inch.

13. The method of claim 11, wherein the first set of electrical components comprises low profile electrical components.

14. The method of claim 11, wherein the frame is formed of a dielectric material with metal leads.

15. The method of claim 11, wherein the lead frame has a hub.

16. The method of claim 11, wherein each of the electrical components of the first set has a ratio of weight to solder area such that it is held in contact with the circuit board during the second reflow soldering.

17. The method of claim 11, further comprising attaching the first set of electrical components with adhesive.

18. The method of claim 11, wherein the circuit board comprises FR-4 material.

19. The method of claim 11, wherein the lead frame is substantially rigid.

20. The method of claim 19 wherein the leads of the frame are substantially coplanar.

21. The method of claim 11, wherein the lead frame is positioned on and in contact with the first side of the circuit board.

* * * * *